United States Patent
Scherr

(10) Patent No.: US 8,552,849 B2
(45) Date of Patent: Oct. 8, 2013

(54) SYSTEM AND METHOD FOR POWER SUPPLY TESTING

(75) Inventor: Wolfgang Scherr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1303 days.

(21) Appl. No.: 12/354,250

(22) Filed: Jan. 15, 2009

(65) Prior Publication Data

US 2010/0177538 A1 Jul. 15, 2010

(51) Int. Cl.
*B60Q 1/00* (2006.01)

(52) U.S. Cl.
USPC .................. 340/438; 340/870.01; 340/870.26; 340/870.39; 340/506; 340/511; 340/514

(58) Field of Classification Search
USPC .......... 340/870.01, 870.26, 870.39, 500, 501, 340/506, 507, 511, 514, 3.43, 438; 702/117; 327/205
See application file for complete search history.

(56) References Cited

U.S. PATENT DOCUMENTS

2004/0148121 A1* 7/2004 de Obaldia et al. ........... 702/117
2006/0230304 A1* 10/2006 Sanada ......................... 713/600

OTHER PUBLICATIONS

Pofahl, E., "The Application of IEC 61508 in the Automotive Industry," Ford Research & Advanced Engineering, D, Summer 2005, pp. 1-6.

* cited by examiner

*Primary Examiner* — Daryl Pope
(74) *Attorney, Agent, or Firm* — Slater & Matsil, L.L.P.

(57) ABSTRACT

In one embodiment, a method of verifying a component coupled to an output of a power supply includes measuring a frequency response from a control input of the power supply to the output of the power supply. The method also includes comparing the frequency response to a predetermined metric based on the measuring. The component is determined to be valid if the frequency response falls within the predetermined metric.

29 Claims, 4 Drawing Sheets

US 8,552,849 B2

SYSTEM AND METHOD FOR POWER SUPPLY TESTING

TECHNICAL FIELD

The invention relates generally to power supply testing, and more particularly to detecting whether a critical energy storage component is properly installed within a power supply system.

BACKGROUND

Automotive safety systems have become increasingly common in the past few years, and, in many cases, their inclusion in automobiles are mandated by government and industry standards. Such electronic safety systems are typically equipped with an energy reserve. In case of power loss, these energy reserve systems supply enough power for the reliable operation of emergency automotive systems, for example, airbag and antilock brake systems. By using such an energy reserve, an airbag can still be deployed during a serious accident if a main battery connection is severed. These energy reserves typically consist of capacitors. During normal operation of the automobile, these capacitors are continually charged by the main car power supply and/or battery.

In order to ensure reliable and safe operation of these energy reserve systems, however, the functionality of these systems are frequently tested by performing an energy reserve measurement (ERM). More particularly, the capacity of the energy reserve as well as the reliability of its connection to the system is verified. If the energy reserve fails or does not function properly because of an electrical failure or loose electrical connection, corrective actions, such as alerting the driver with a warning light, disabling certain functions, or even setting the device in a fail-safe mode, can be taken. Lately, the inclusion of reliable ERM systems have become more critical as the automotive industry is moving toward safety requirements compliance with such standards as IEC 61508, which defines various safety integrity levels (SIL).

One conventional method used to test an energy reserve system is to disconnect the energy reserve storage capacitor from its power supply and measure its electrical characteristics. These measurements are conventionally made while the automobile is starting up, for example, when the key is being turned in the ignition. One drawback of this method of testing is that the ERM is being made only while the car is starting up, therefore, a component failure that occurs after the ERM, or intermittent failures that only occur while the car is operating will not be detected. An example of this is when a capacitor with a bad solder joint that loses connectivity due to vibration. Another possible drawback is a lack of connectivity due to a failed ERM test cycle. For example, the test circuit that disconnects the energy reserve storage capacitor from the power supply during testing suffers a failure and does not reconnect the capacitor when the test cycle is complete.

What are needed are reliable systems and methods for energy reserve measurement (ERM) for electronic automotive safety systems.

SUMMARY OF THE INVENTION

In one embodiment, a method of verifying a component coupled to an output of a power supply is disclosed. The method includes measuring a frequency response from a control input of the power supply to the output of the power supply. The method also includes comparing the frequency response to a predetermined metric based on the measuring. The component is determined to be valid if the frequency response falls within the predetermined metric.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to illustrate clearly the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an ERM system for an automotive safety system. The invention may also be applied, however, to other systems such as general power supply systems and/or other systems that perform in-situ circuit testing and verification.

Figure 1:
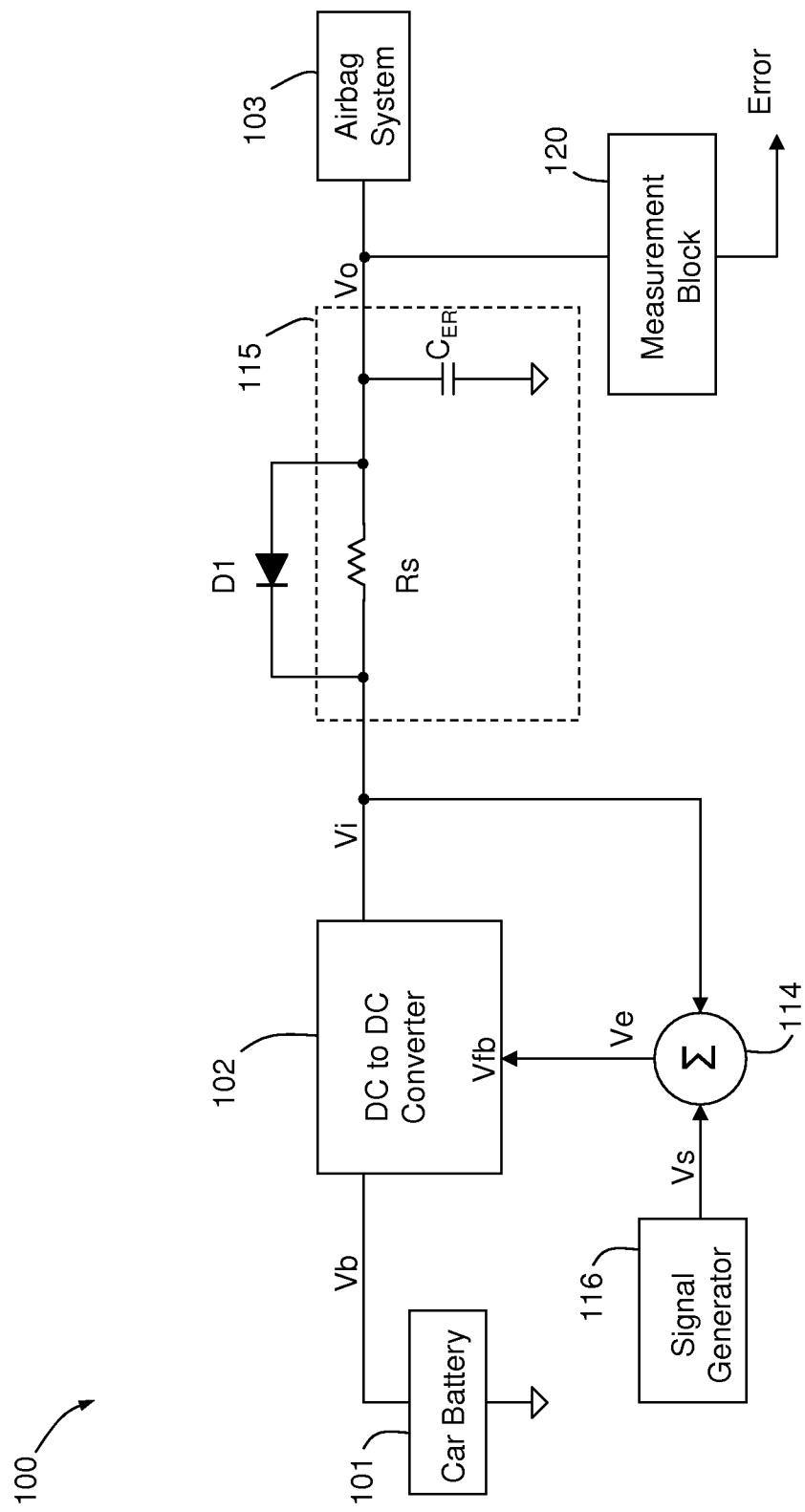
FIG. 1 illustrates a schematic of an embodiment power supply system.

FIG. 1 illustrates an embodiment power supply system 100 to provide power to automotive airbag system 103. Power supply system 100 essentially transfers energy from car battery 101 to energy reserve capacitor $C_{ER}$ using switched mode DC/DC converter 102 that converts input voltage Vb, typically about 12V, to a higher voltage, typically between about 25V and 35V. This higher voltage is used to deploy pyrotechnic devices within airbag system 103. In preferred embodiments of the present invention, energy reserve capacitor $C_{ER}$, an electrolytic capacitor in the millifarad range, preferably between about 1 mF and about 20 mF, stores charge to power airbag system 103 in the event of airbag deployment. In alternative embodiments, other load capacitance values outside this range can be implemented. Resistor $R_S$ parallel with energy reserve capacitor $C_{ER}$ limits the charging current in case capacitor $C_{ER}$ is substantially discharged. The high voltage at Vo is set to provide enough energy to reliably power airbag system 103, yet still be within the voltage limits of the energy reserve capacitor $C_{ER}$. In alternative embodiments of the present invention, where other systems besides automotive airbag systems are powered, different voltage levels and component values can be used depending on the particular application.

To ensure reliable operation, however, proper verification of the energy reserve capacitor $C_{ER}$ is desirable. Even if the system has no defects when manufactured, situations may occur that would prevent energy reserve capacitor $C_{ER}$ from supplying adequate power to deploy the airbag. For example, the connection of electronic devices within the system to printed circuit boards (PCBs) can be mechanically damaged. Physically large devices with a certain mass, such as the large electrolytic capacitors typically used for $C_{ER}$, are especially susceptible to mechanical shock and vibration during the operation of an automobile. Large electrolytic capacitors also drift over their lifetime due to electrical stress from charging and discharging cycles, thermal stress, and aging of materials. Furthermore, the failure of other components coupled to energy reserve capacitor $C_{ER}$ to can also reduce the capability of energy reserve capacitor $C_{ER}$ to store the required amount of energy to deploy the airbag.

In conventional air bag power supply systems, one way to test the presence and energy capacity of energy reserve capacitor $C_{ER}$ is by enabling a current sink coupled to Vo to draw a defined DC current first and then disabling and re-enabling DC to DC converter 102 again. By measuring the voltage at Vo during this procedure, the functionality of an output capacitor can be checked. Another conventional testing method includes measuring a charging curve at Vo at power-up. A disadvantage of this methods is that the measurement is performed usually only when starting the car and not during operation of the automobile, as some standard mandate that full energy is provided on the capacitor during operation of the automobile. Furthermore, the measurement using the alternative method can only be performed when energy reserve capacitor $C_{ER}$ is in a discharged state. Further diagnostic tests of airbag system 103 must be delayed until the power-on cycle and $C_{ER}$ testing is finished. The reason is that the current in and out of the capacitor $C_{ER}$ needs to be well defined to ensure that a different behavior is caused by a defective capacitor and not due to some undetermined additional charge or discharge current connected at node Vo. Therefore, some performance problems that occur while $C_{ER}$ is in its fully charged state during operation may not be detected.

In preferred embodiments of the present invention, the presence and value of energy reserve capacitor $C_{ER}$ can be measured during operation of power supply system 100 by measuring the frequency response of the RC circuit formed by series resistor Rs and energy reserve capacitor $C_{ER}$, for example, Vo(s)/Vi(s). Small test tones are injected into the feedback voltage Vfb at the control input to DC/DC converter 102. A typical amplitude for these test tones is in the millivolt range. Alternatively, other voltage ranges can be used. Measurement block 120 coupled to node Vo measures these tones and determines whether the frequency response of the power supply system is within an expected range of responses.

The corner frequency of the RC circuit formed by series resistor Rs and energy reserve capacitor $C_{ER}$ is:

$$fc = \frac{1}{2\pi\tau},$$

Where time constant $\tau=Rs*C_{ER}$. In preferred embodiments of the present invention, $C_{ER}$ is quite large, for example between about 1 mF and about 20 mF. For example, the corner frequency fc for a power supply system with Rs=100Ω and $C_{ER}$=20 mF is about 80 mHz.

With typical device tolerances for Rs and $C_{ER}$, time constant τ varies about +/−20%, therefore fc can vary between 67 mHz and 100 mHz.

Figure 2:
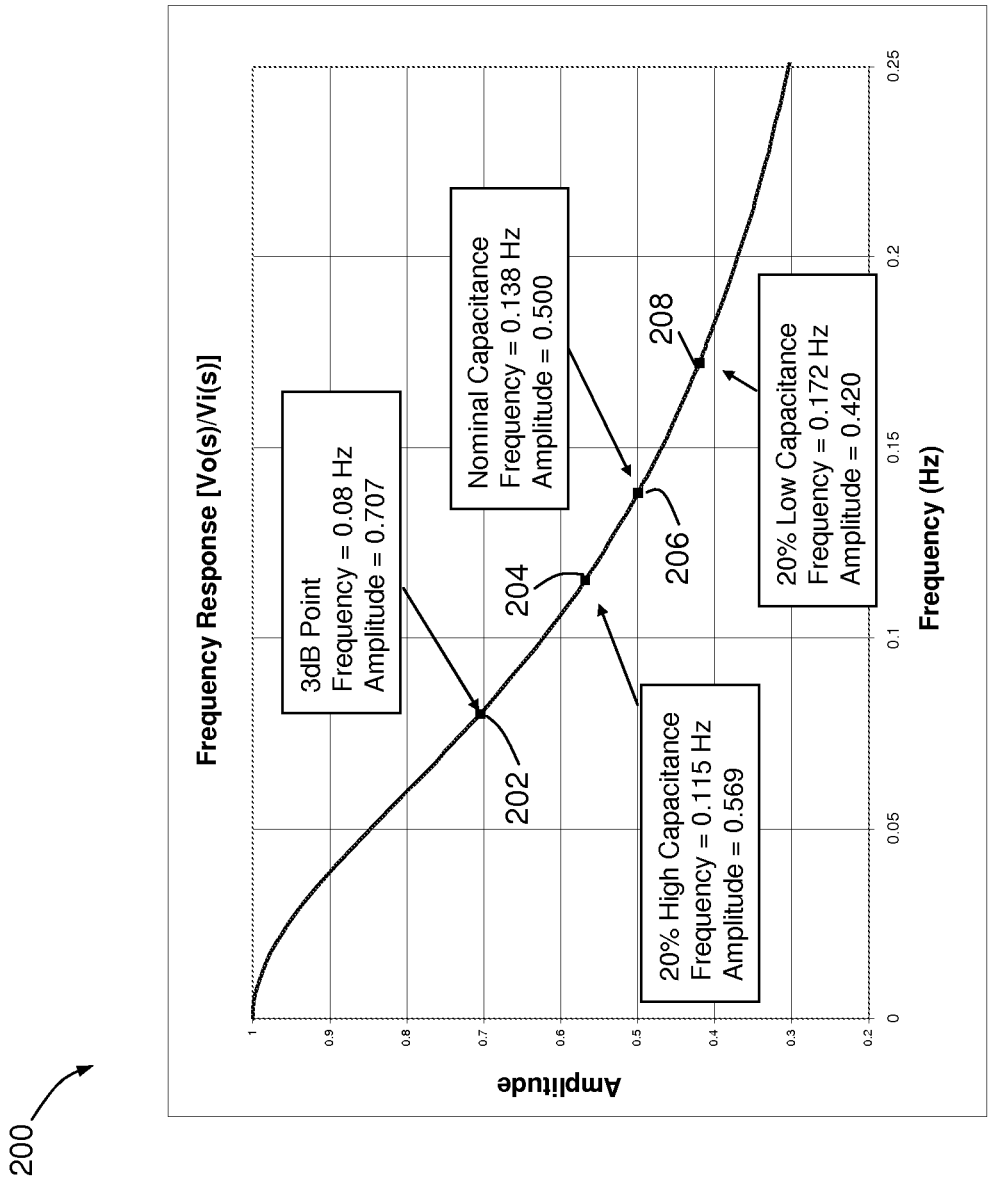
FIG. 2 illustrates a frequency response of an embodiment power supply system.

Turning to FIG. 2, a Bode plot 200 of an RC circuit with fc=80 mHz is shown with the linear amplitude plotted against linear frequency. The 3 dB corner frequency is shown at point 202. In preferred embodiments of the present invention, however, 6 dB point 206 is used as a measurement reference point, which is shown as an amplitude of 0.5 at 138 mHz. The 6 dB point is used because the higher measurement frequencies can be performed faster than lower frequencies and gives a higher voltage margin for the actual measurement and calculation of the output over input voltage ratio on Rs. When a +/−20% variation of time constant τ is taken into account, the 6 dB point can occur between 115 mHz and 172 mHz shown at points 208 and 204 respectively. These points correspond to amplitudes responses of 0.420 at point 208 and 0.569 at point 204. In alternative embodiments of the present invention, however, 3 dB point 202 or any other convenient point on the transfer function can be used to allow an efficient implementation of the diagnosis function.

Turning back to FIG. 1, in an embodiment of the present invention, the frequency response is measured by producing two successive tones from signal generator 116. The first tone produces is a low frequency tone, f1, which is within the passband of the RC circuit formed by Rs and $C_{ER}$; for example, f1 could be about 20 mHz for the example described hereinabove. The output of the signal generator is summed with output Vi of DC/DC converter 102 by summing block 114, and the output of the summing block 114 is provided to the feedback Vfb of DC/DC converter 102. This has the effect of producing a small tone at f1 riding on the output of DC/DC converter 102. For example, if the DC/DC converter 102 is set to provide an output voltage of 25V and the amplitude of signal generator 116 is a sinewave with an amplitude of 20 mV peak-to-peak, the output of DC/DC converter 102 at node Vi will be a 20 mV peak-to-peak sinewave with a peak-to-peak amplitude of 20 mV.

According to preferred embodiments of the present invention, during the time that the output of DC/DC converter 102 is modulated by f1, measurement block 120 measures the power and stores the measurement. After the measurement is stored, signal generator 116 then outputs a second tone at frequency f2. Frequency f2 is preferably at the 6 dB point of the RC circuit formed by Rs and $C_{ER}$, however, other frequencies can be used in alternative embodiments of the present invention. In the present example, however, f2 would be about 138 mHz. During the time that the output of DC/DC converter 102 is modulated by f2, measurement block 120 again measures the power. The measure power for f1 and f2 are compared with preset limits. The Error signal is asserted if these measurements are not within the preset limits.

In preferred embodiments, these preset limits correspond with the +/−20% tolerances for τ. For the example given above, these limits correspond to amplitude measurements of between about 0.420 and 0.569. In alternative embodiments of the present invention, other tolerances, measurement frequencies and limit levels can be used.

In an alternative embodiment of the present invention, both f1 and f2 can be output simultaneously from signal generator 116. Consequently, measurement block 120 would have circuitry to separate f1 and f2 and measure the amplitude of each tone, for example, using analog filters and power detectors, or by using digital signal processing techniques. In further embodiments of the present invention, more than two tones can be used, or even noise can be used. In embodiments using noise or multiple tones, the spectral shape of the RC filter 115 can be estimated using digital signal processing in the frequency domain by using matched filter techniques and diagnosed based on signal amplitudes or Fourier and Fast-Fourier transformations (FFT). The results of these measurements are preferably analyzed by evaluating signal energies at specified frequencies, for example, at f1 and f2.

Figure 3A:
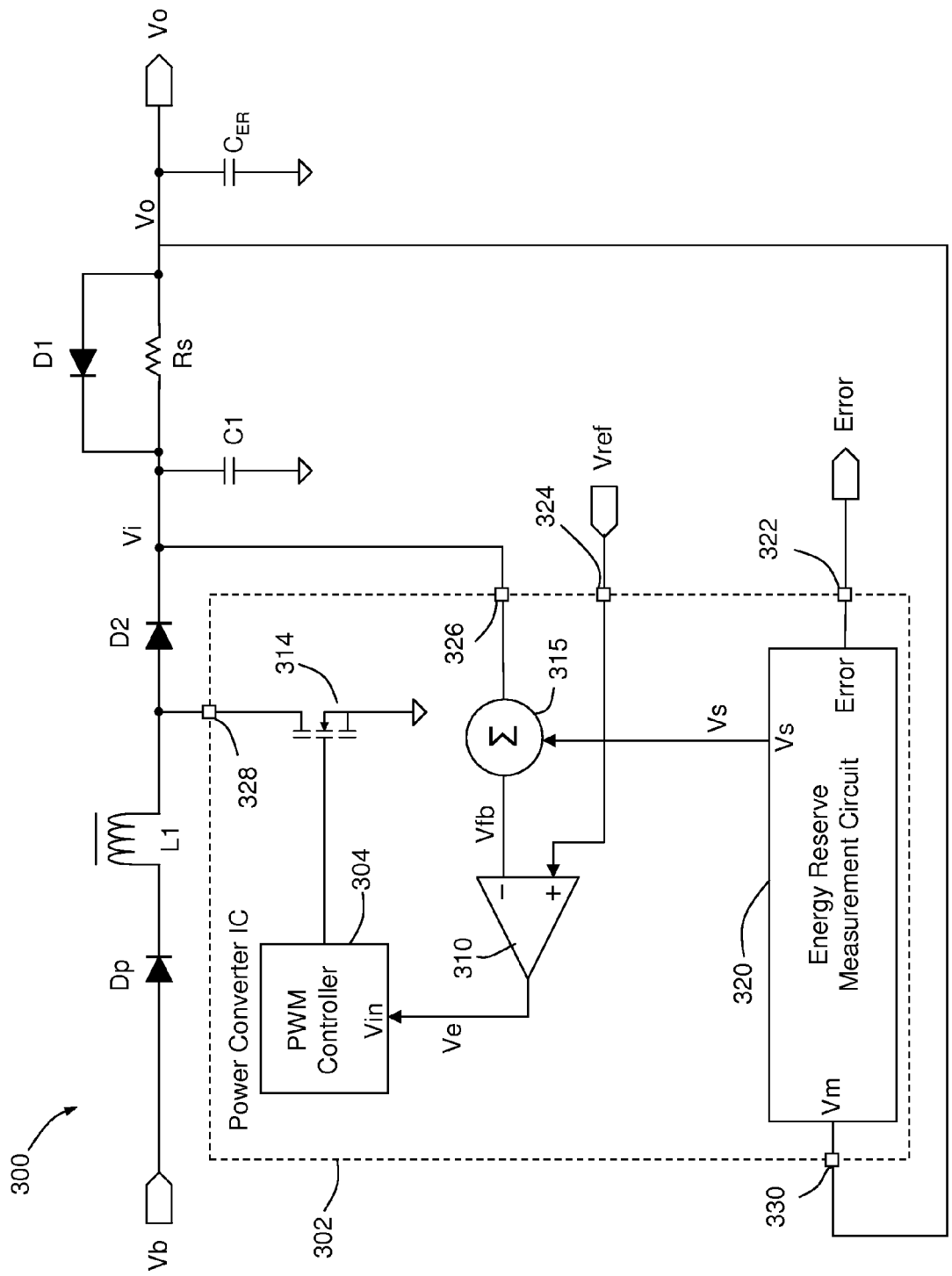
FIGS. 3a and 3b illustrates a schematic of a power supply system using an embodiment integrated circuit (IC).
Figure 3B:
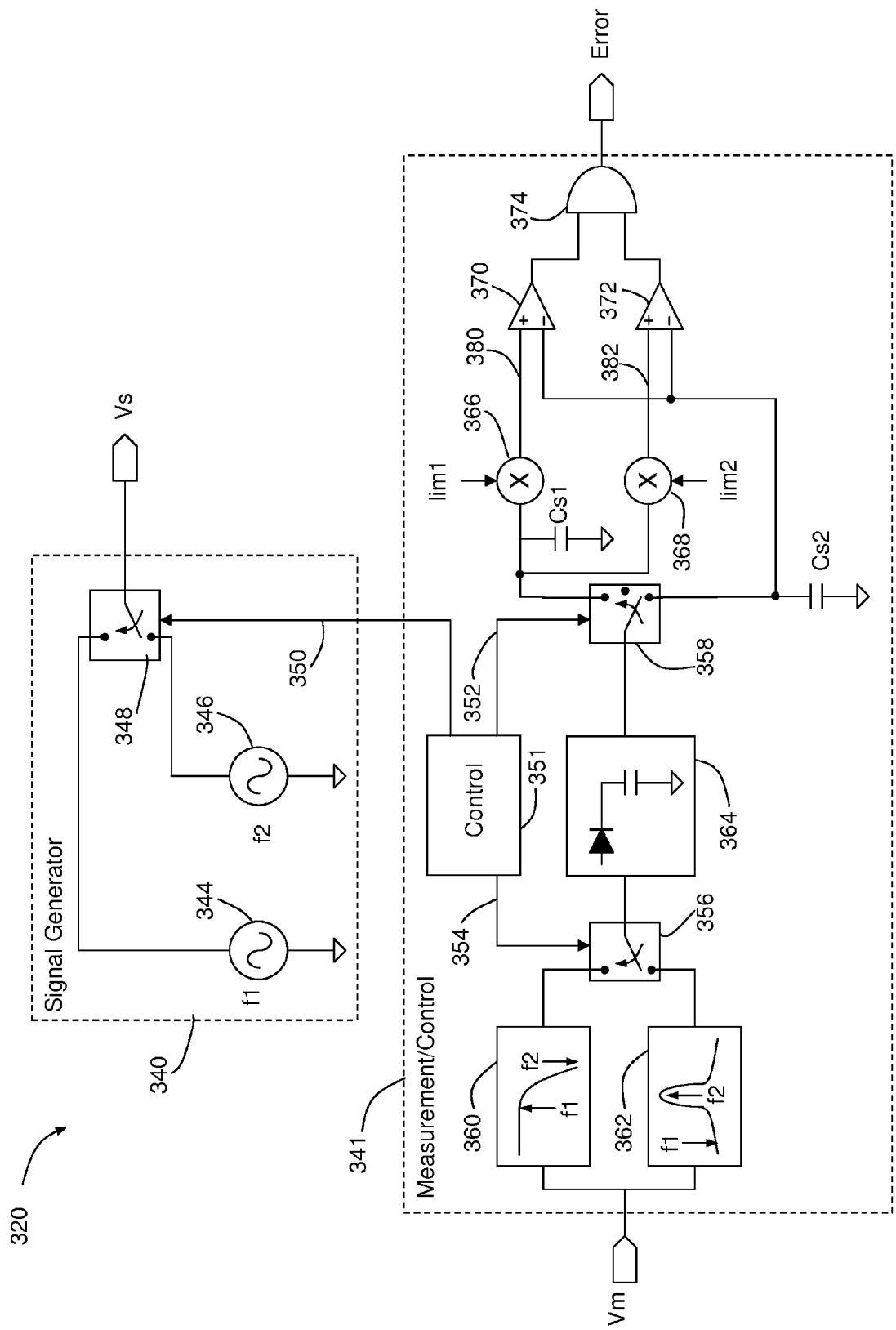

FIGS. 3a-3b illustrate a power supply system 300 using a power converter IC 302 according to a preferred embodiment of the present invention. Power converter IC 302 contain a portion of the circuitry of power supply system 300. Power converter IC 302 is coupled to the rest of the system via pads 322, 324, 326 and 328.

In a preferred embodiment of the present invention, power supply system 300 is implemented as a switched-mode boost converter. Car battery 101 (FIG. 1) is preferably coupled to input Vb, and therefore inductor L1 via reverse polarity/low voltage protection diode Dp. Inductor L1 is coupled to node Vi via diode D2 and to ground via switching transistor 314 within power converter IC 302. Node Vi is coupled to energy reserve capacitor $C_{ER}$ via series resistance Rs. Diode D1 is preferably placed in parallel with Rs. Switching transistor 314 is driven by PWM controller 304, which is controlled by differential amplifier 310. PWM controller 304 and switching transistor 314 are implemented using conventional techniques known in the art.

Differential Amplifier 310 amplifies the voltage difference between feedback voltage Vfb and reference voltage Vref to form error signal Ve. In preferred embodiments of the present invention, Vfb is the sum of converter output voltage Vi and signal generator output voltage Vs generated by a signal generator within Energy Reserve Measurement (ERM) Circuit 320. Vfb is preferably formed by summing block 315, which is implemented according to techniques known in the art, for example using a resistive summer or an active summer. In alternative embodiments of the present invention, voltage Vi can be scaled using, for example, a resistive voltage divider (not shown) so that the internal circuitry of the power converter IC 302 operates at lower voltages than the voltages generated at Vi and Vo. If voltage Vi is scaled, reference Vref is preferably scaled also. In other embodiments of the present invention, Vref can be generated internally. In further alternative embodiments, signal generator output voltage Vs can be summed with reference voltage Vref using summer 315 instead of being summed with Vi.

During power supply system operation, energy is stored in L1 when switching transistor 314 is turned ON. When switching transistor 314 is turned OFF, a large voltage is induced at the drain of transistor 314 and current flows through D2 and charges capacitor C1. C1 is preferably small enough to prevent large transient inrush currents to flow though Dp, L1 and D2 when power is first applied at node Vb. In preferred embodiments, C1 has a capacitance value is between about 10 µF and about 100 µF. Series resistor Rs is preferably between about 10Ω and about 500Ω to limit inrush currents to $C_{ER}$ at power-up and to provide a filtered power supply voltage at node Vo. In alternative embodiments of the present invention, different component arrangement and values can be used according to the application.

In preferred embodiments of the present invention, power converter IC 302, and components D1, D2, Dp, L1, C1 and $C_{ER}$ are soldered to a single circuit board. In other embodiments, these components can be arranged on more than one circuit board. In further alternative embodiments, the components shown FIG. 3a can be partitioned differently between the circuit board and within power converter IC 302. For example, switching transistor 314, summing block 315, and/or differential amplifier 310 can be implemented externally from power converter IC 302.

A schematic of energy reserve measurement circuit 320 is shown in FIG. 3b according to a preferred embodiment of the present invention. Signal generator 340 has a first signal generator 344 that generates in-band signal f1, and a second signal generator 346 that generates transition band signal f2. These signal generators are preferably implemented as direct digital frequency synthesizers (DDS) or conventional analog signal generators. Signals f1 and f2 are preferably sinusoidal to avoid a large spectrum on the corresponding output signal and are of as low amplitude as possible to provide for a reasonable diagnosis while avoiding unnecessary spurious emissions. Switch 348 under the control of control block 351 selects between signal generators 344 and 346. In alternative embodiments of the present invention, signal generator 340 can be implemented by a variable frequency oscillator, by a divided clock output or digitally using a digital signal processor and a D/A converter. These signals are usually fed to a feedback loop (not shown) on a voltage regulator circuit to provide enough output power to the system.

Measurement and control block 341 has lowpass filter 360 and bandpass filter 362 in preferred embodiments. Lowpass filter 360 is configured to pass frequency f1 and reject frequency f2, while bandpass filter 362 is configured to pass frequency f2 and reject frequency f1. In alternative embodiments, lowpass filter 360 can be replaced by a bandpass filter configured to pass frequency f1 and reject frequency f2. Filters 360 and 362 are preferably implemented using analog filters, when sources 344 and 346 are implemented in the analog domain, or using digital filters or DSP techniques, when sources 344 and 346 are implemented in the digital domain using, for example, DDS techniques. These digital filters can be also synchronized to its sources (matched filters), which allows for much lower amplitudes for the sources. In alternative embodiments of the present invention, filter 360 and 362 can be eliminated or replaced by a single lowpass filter depending on the expected noise environment. In further embodiments of the present invention, filters 360 and 362 can be implemented digitally if an A/D converter (not shown) is placed between node Vm and filters 360 and 362.

Switch 356, under the control of control block 351 via control line 354, selects between lowpass filter 360 and bandpass filter 362. The output of one of filters 360 and 362 is measured by a peak amplitude detector 364. Peak detector 364 is preferably implemented using an analog rectifier principle or a DSP based peak detector (e.g. a signal tracking algorithm using a maximum value storage). In alternative embodiments, other signal detection techniques can be used.

In preferred embodiments, the output of peak detector 364, when first signal generator 344 is active, is sampled on capacitor Cs2 using switch 358 under the control of control block 351 via control line 352. When second signal generator 346 is active, on the other hand, the output of peak detector 364 is sampled on sampling capacitor Cs1. The voltage on capacitor Cs1 is multiplied by lim1 and lim2 using multipliers 366 and 368. These products 380 and 382 are compared with the voltage on capacitor Cs2 which is the sampled output of peak amplitude detector 364 when f1 was active. In preferred embodiments of the present invention, lim1 and lim2 are set to e.g. detect a +/−30% amplitude change for the two frequencies. The comparison is preferably made using comparators or differential amplifiers 370 and 372 and AND gate 374. Error signal Error taken from the output of AND gate 374 indicates whether the difference in amplitudes of the power supply output at Vo (FIG. 3a) are within the range of allowable amplitudes. This indicates whether or not $C_{EF}$ is installed correctly and whether or not $C_E$ is within a valid range. In alternative embodiments of the present invention, the derivation of the Error signal can occur in the digital domain. For example, the output of power detector 364 can be digitized using an A/D converter (not shown). Outputs of the A/D converter can be stored in registers and the Error signal derived using a logical algorithm, look-up table, ROM, for example.

During operation of energy reserve measurement circuit 320, control block 352 first selects lowpass filter 360 via control line 354 using switch 358, f1 signal generator 344 via signal line 350 using switch 356, and storage capacitor Cs2 via signal line 352 using switch 358, thereby coupling lowpass filter 360 to power detector 364 and the output of the power detector to capacitor Cs2. This first step modulates node Vi (FIG. 3a) at frequency f1 and detects the power of this signal at node Vo. In the second step of operation, control block 351 next selects bandpass filter 362 using switch 356, routes the output of bandpass filter 362 to amplitude detector 364. The output of amplitude detector 364 is sampled on capacitor Cs2. In the third step, switch 358 remains disconnected from both Cs1 and Cs2 and the Error signal is updated.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted.

What is claimed is:

1. A method of verifying a component coupled to a power supply, the method comprising:
   measuring a frequency response from a control input of the power supply to an output of the power supply;
   comparing the frequency response to a predetermined metric based on the measuring;
   based on the comparing, determining that the component is valid and that the component is effectively coupled to the output of the power supply if the frequency response falls within the predetermined metric; and
   applying a non-zero DC voltage to the component from the power supply after determining that the component is valid and that the component is effectively coupled to the power supply.

2. The method of claim 1, wherein measuring comprises:
   applying a signal comprising a first frequency to the control input of the power supply;
   measuring an amplitude of the first frequency at the output of the power supply;
   applying a signal comprising a second frequency to the control input of the power supply; and
   measuring an amplitude of the second frequency at the output of the power supply.

3. The method of claim 2, wherein the predetermined metric comprises a range of attenuation between the amplitude of the first frequency and the amplitude of the second frequency.

4. The method of claim 3, wherein the range of attenuation comprises a range of between about 4 dB and about 7 dB of attenuation.

5. The method of claim 2, further comprising choosing the first and second frequencies, choosing comprising:
   selecting the first frequency to be within a passband of a nominal frequency response from the control input of the power supply to the output of the power supply when the component assumes a nominal value and when the component is effectively coupled to the output of the power supply; and
   selecting the second frequency to be within an attenuation band of the nominal frequency response.

6. The method of claim 5, wherein selecting the second frequency comprises selecting the second frequency to be at about a 6 dB attenuation point on the nominal frequency response with respect to the first frequency.

7. The method of claim 1, further comprising asserting an error signal if the component is not determined to be valid based on the determining.

8. The method of claim 1, wherein the component is effectively coupled to the power supply when a connection between the component and a circuit board is not mechanically damaged.

9. A method of verifying a component coupled to a power supply, the method comprising:
   measuring a frequency response from a control input of the power supply to an output of the power supply;
   comparing the frequency response to a predetermined metric based on the measuring; and
   based on the comparing, determining that the component is valid and that the component is effectively coupled to the power supply if the frequency response falls within the predetermined metric, wherein the component comprises a capacitor, and the frequency response is dependent on a value of the capacitor and is dependent on whether the capacitor is effectively coupled to the output of the power supply.

10. A power converter integrated circuit (IC) configured to be coupled to a power supply system, the IC comprising:
    a switch controller configured to be coupled to a switch;
    a summing block comprising an output coupled to an input of the switch controller;
    a reference input coupled to a first input of the summing block, the reference input configured to be coupled to a first output of the power supply system;
    a signal generator coupled to a second input of the summing block, wherein the signal generator is configured to output a plurality of frequencies; and
    a measurement block configured to measure amplitudes at a second output of the power supply system over the plurality of frequencies; and
    a comparison block coupled to the measurement block, the comparison block comprising an output signal indicating whether the amplitudes at the second output of the power supply system are within a range of expected amplitudes.

11. The IC of claim 10, further comprising the switch.

12. A power supply system comprising the IC of claim 11.

13. The power supply system of claim 12, further comprising a buck converter.

14. The power supply system of claim 12 further comprising:
    an inductor coupled between an input supply and the switch;
    a diode coupled between the switch and the first power supply system output;
    a series resistance coupled between the first power supply system output and the second power supply output; and
    a load capacitor coupled from the second power supply system output to a reference voltage, wherein the IC is configured to detect a presence of the load capacitor.

15. The power supply system of claim 14, wherein the range of expected amplitudes correspond to nominal frequency responses measured over a range of nominal load capacitor values, wherein the IC is configured to detect the presence of the load capacitor if the range of expected amplitudes correspond with the nominal frequency responses.

16. The power supply system of claim 12, wherein the second output is coupled to squib drivers of an automotive airbag system.

17. The IC of claim 10, wherein:
the signal generator is configured to output a signal at a first frequency and a signal at a second frequency, the second frequency greater than the first frequency;
the measurement block comprises,
    a first filter coupled to the second output of the power supply system, the first filter configured to pass signals of a first frequency and attenuate signals of a second frequency,
    a second filter coupled to the second output of the power supply system, the second filter configured to pass signals of the second frequency and attenuate signals of the first frequency, and
    a power detector coupled to the output of the first filter and the second filter; and
the comparison block comprises a comparator coupled to an output of the power detector, the comparator configured to compare the output of the power detector with predefined limits, and assert an error signal if the output of the power detector is not within the predefined limits.

18. The IC of claim 17, wherein the measurement block further comprises an analog to digital converter, and wherein the first and second filters, power detectors, and comparison block are implemented in a digital domain.

19. The IC of claim 17, wherein:
the first filter comprises a lowpass response; and
the second filter comprises a bandpass response.

20. The IC of claim 19, wherein:
the range of expected amplitudes are chosen to correspond to a nominal frequency response of the power supply system when loaded with a first capacitor, the first capacitor comprising a range of nominal values when properly installed within the power supply system; and
the error signal indicates that the first capacitor is not within the range of nominal values and/or the first capacitor is not properly installed within the power supply system.

21. A power supply system comprising:
a power converter comprising a regulated output and a control input;
a summing block comprising
    an output coupled to the control input,
    a first input coupled to the regulated output, and
    a second input;
a signal generator comprising an output coupled to the second input of the summing block, the signal generator configured to output a plurality of frequencies;
a series resistance comprising a first node coupled to the regulated output;
a load capacitor coupled between a second node of the series resistance and a reference voltage;
a measurement block coupled to the load capacitor at the second node of the series resistance, the measurement block configured to
    measure an amplitude of each of the plurality of frequencies,
    determine whether the amplitude of each of the plurality of frequencies fall within a predetermined range of amplitudes; and
    provide a status signal indicating whether the load capacitor comprises a value within a nominal range of load capacitor values and is properly installed within the power supply system.

22. The power supply system of claim 21, wherein the predetermined range of amplitudes correspond with an expected system frequency response assuming the nominal range of load capacitor values.

23. The power supply system of claim 22, wherein the plurality of frequencies comprise a first frequency and a second frequency, the first frequency lying within a passband of the expected system frequency response and the second frequency lying within an attenuation band of the expected system frequency response.

24. The power supply system of claim 23, wherein:
the expected system frequency response taken at the second frequency is attenuated by about 6 dB with respect to the expected system frequency response taken at the first frequency; and
the measurement block is further configured to assert the status signal if the amplitude measured at the second frequency is attenuated between about 7 dB and about 5 dB with respect to the amplitude measured at the first frequency.

25. The power supply system of claim 21, wherein the power converter comprises a buck converter configured to convert an automotive battery voltage to a supply for an airbag system.

26. The power supply system of claim 21, wherein the load capacitor comprises an energy reserve for an electrical system.

27. The power supply system of claim 21, wherein the load capacitor comprises a nominal value between about 1 mF and 20 mF.

28. A device, comprising:
a measurement block configured to:
    measure a frequency response from a control input of a switched mode power supply to an output of the switched mode power supply;
    compare the frequency response to a predetermined metric based on the measuring; and
    determine that a component is valid and that the component is effectively coupled to the switched mode power supply if the frequency response falls within the predetermined metric.

29. The device of claim 28, wherein the component is effectively coupled to the switched mode power supply when a connection between the component and a circuit board is not mechanically damaged.

* * * * *